United States Patent
Oganesian et al.

(10) Patent No.: US 8,835,223 B2
(45) Date of Patent: Sep. 16, 2014

(54) CHIP ASSEMBLY HAVING VIA INTERCONNECTS JOINED BY PLATING

(71) Applicant: Tessera, Inc., San Jose, CA (US)

(72) Inventors: Vage Oganesian, Sunnyvale, CA (US); Belgacem Haba, Saratoga, CA (US); Ilyas Mohammed, Santa Clara, CA (US); Craig Mitchell, San Jose, CA (US); Piyush Savalia, San Jose, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 14/162,011

(22) Filed: Jan. 23, 2014

(65) Prior Publication Data

US 2014/0131892 A1    May 15, 2014

Related U.S. Application Data

(63) Continuation of application No. 12/883,421, filed on Sep. 16, 2010, now Pat. No. 8,685,793.

(51) Int. Cl.
| | | |
|---|---|---|
| *H01L 29/788* | (2006.01) | |
| *H01L 23/00* | (2006.01) | |
| *H01L 23/538* | (2006.01) | |

(52) U.S. Cl.
CPC ............ *H01L 24/80* (2013.01); *H01L 23/5384* (2013.01)
USPC ........... 438/109; 438/121; 438/667; 438/107; 438/113; 257/774; 257/690; 257/686; 257/693; 257/737; 257/368; 257/E21.598; 257/E21.499; 257/E21.597

(58) Field of Classification Search
CPC .................. H01L 2224/48472; H01L 23/481; H01L 2225/06541; H01L 23/522; H01L 2924/01078; H01L 2924/01079; H01L 2924/01029; H05K 1/0271; H05K 3/3436
USPC ................. 257/686, 693, 737, 774, 690, 368, 257/E21.598, E21.499, E21.214, E21.597; 438/667
See application file for complete search history.

(56) References Cited

U.S. PATENT DOCUMENTS

| | | |
|---|---|---|
| 5,481,133 A | 1/1996 | Hsu |
| 6,582,991 B1 | 6/2003 | Maeda et al. |

(Continued)

FOREIGN PATENT DOCUMENTS

| | | |
|---|---|---|
| DE | 19516487 C1 | 7/1996 |
| EP | 1801866 A2 | 6/2007 |

(Continued)

OTHER PUBLICATIONS

International Search Report and Written Opinion from PCT/US2010/000777, dated Nov. 19, 2010.

(Continued)

*Primary Examiner* — Jerome Jackson, Jr.
*Assistant Examiner* — Bo Fan
(74) *Attorney, Agent, or Firm* — Lerner, David, Littenberg, Krumholz & Mentlik, LLP

(57) ABSTRACT

An assembly and method of making same are provided. The assembly can be formed by juxtaposing a first electrically conductive element overlying a major surface of a first semiconductor element with an electrically conductive pad exposed at a front surface of a second semiconductor element. An opening can be formed extending through the conductive pad of the second semiconductor element and exposing a surface of the first conductive element. The opening may alternatively be formed extending through the first conductive element. A second electrically conductive element can be formed extending at least within the opening and electrically contacting the conductive pad and the first conductive element. A third semiconductor element can be positioned in a similar manner with respect to the second semiconductor element.

43 Claims, 10 Drawing Sheets

(56) References Cited

U.S. PATENT DOCUMENTS

| | | |
|---|---|---|
| 6,812,549 B2 | 11/2004 | Umetsu et al. |
| 2004/0016942 A1 | 1/2004 | Miyazawa et al. |
| 2004/0188822 A1 | 9/2004 | Hara |
| 2005/0156330 A1 | 7/2005 | Harris |
| 2005/0287783 A1 | 12/2005 | Kirby et al. |
| 2007/0037379 A1 | 2/2007 | Enquist et al. |
| 2007/0126085 A1 | 6/2007 | Kawano et al. |
| 2007/0126121 A1 | 6/2007 | Shue et al. |
| 2007/0269931 A1 | 11/2007 | Chung et al. |
| 2008/0284041 A1 | 11/2008 | Jang et al. |
| 2009/0032966 A1 | 2/2009 | Lee et al. |
| 2009/0065907 A1 | 3/2009 | Haba et al. |
| 2009/0121323 A1 | 5/2009 | Kwon et al. |
| 2009/0166840 A1 | 7/2009 | Kang et al. |
| 2009/0309235 A1 | 12/2009 | Suthiwongsunthorn et al. |
| 2010/0044869 A1 | 2/2010 | Zhang et al. |
| 2010/0193945 A1* | 8/2010 | Hochstenbach et al. ...... 257/737 |
| 2010/0224987 A1* | 9/2010 | Hochstenbach ............. 257/693 |
| 2010/0230795 A1* | 9/2010 | Kriman et al. ................ 257/686 |
| 2011/0089555 A1* | 4/2011 | Shau ............................. 257/690 |
| 2011/0115097 A1* | 5/2011 | Shau ............................. 257/774 |
| 2012/0018893 A1 | 1/2012 | Oganesian et al. |

FOREIGN PATENT DOCUMENTS

| | | |
|---|---|---|
| JP | 2001217386 A | 8/2001 |
| KR | 20060020822 A | 3/2006 |
| WO | 2009017758 A2 | 2/2009 |
| WO | 2009017835 A2 | 2/2009 |
| WO | 2009023462 A1 | 2/2009 |
| WO | 2010104610 A2 | 9/2010 |

OTHER PUBLICATIONS

International Search Report and Written Opinion, PCT/US2008/009356, dated Feb. 19, 2009.

Office Action from U.S. Appl. No. 12/221,204, dated Apr. 28, 2011.

Office Action from U.S. Appl. No. 12/221,204, dated Jun. 10, 2010.

* cited by examiner

CHIP ASSEMBLY HAVING VIA INTERCONNECTS JOINED BY PLATING

CROSS-REFERENCE TO RELATED APPLICATIONS

The present application is a continuation of U.S. patent application Ser. No. 12/883,421, filed on Sep. 16, 2010, the disclosure of which is incorporated herein by reference.

BACKGROUND OF THE INVENTION

The present invention relates to packaging of microelectronic devices, especially the packaging of semiconductor devices.

Three-dimensional chip stacking can be done in a variety of ways. In some examples, chips can be wire-bonded with spacers therebetween, the chips can be staggered with respect to each other or both. In some cases, chips can include through silicon vias which extend between the front and rear surfaces thereof for electrical connection at the front and rear surfaces to other chips.

Size is a significant consideration in any physical arrangement of chips. The demand for more compact physical arrangements of chips has become even more intense with the rapid progress of portable electronic devices. Merely by way of example, devices commonly referred to as "smart phones" integrate the functions of a cellular telephone with powerful data processors, memory and ancillary devices such as global positioning system receivers, electronic cameras, and local area network connections along with high-resolution displays and associated image processing chips. Such devices can provide capabilities such as full internet connectivity, entertainment including full-resolution video, navigation, electronic banking and more, all in a pocket-size device. Complex portable devices require packing numerous chips into a small space. Moreover, some of the chips have many input and output connections, commonly referred to as "I/O's." These I/O's must be interconnected with the I/O's of other chips. The interconnections should be short and should have low impedance to minimize signal propagation delays. The components which form the interconnections should not greatly increase the size of the assembly. Similar needs arise in other applications as, for example, in data servers such as those used in internet search engines. For example, structures which provide numerous short, low-impedance interconnects between complex chips can increase the bandwidth of the search engine and reduce its power consumption.

Further improvements can be made to stacked semiconductor element assemblies using through silicon vias.

BRIEF SUMMARY OF THE INVENTION

A first aspect of the present invention is a method of forming a stacked microelectronic assembly comprising the steps of (a) juxtaposing a first electrically conductive element overlying a major surface of a first semiconductor element with an electrically conductive pad exposed at a front surface of a second semiconductor element; (b) forming an opening extending through the conductive pad of the second semiconductor element and exposing a surface of the first conductive element, wherein forming an opening may include forming a first opening extending from a major surface of the second semiconductor element towards the front surface thereof, and a second opening extending from the first opening through the conductive pad, wherein where the first and second openings meet, interior surfaces of the first and second openings extend at different angles relative to the major surface of the second semiconductor element; and (c) forming a second electrically conductive element through the conductive pad, the second conductive element extending at least within the opening and through a thickness of the second semiconductor element, the second conductive element electrically contacting the conductive pad and the first conductive element.

In accordance with certain embodiments of this first aspect, at least the second semiconductor element may have a plurality of active semiconductor devices disposed therein. The first semiconductor element may have a plurality of active semiconductor devices disposed therein. The first semiconductor element may have a front surface remote from the major surface, an opening extending between the front and major surfaces at least partly underlying a surface of a conductive pad exposed at the front surface of the first semiconductor element, wherein the first conductive element is electrically connected to the conductive pad of the first semiconductor element through the opening in the first semiconductor element. The opening of the first semiconductor element may include a first opening extending from the major surface thereof towards the front surface thereof, and a second opening extending from the first opening to the conductive pad, wherein where the first and second openings meet, interior surfaces of the first and second openings extend at different angles relative to the major surface of the first semiconductor element. The entirety of the conductive pad of the second semiconductor element may overlie the major surface of the first semiconductor element.

The opening in the second semiconductor element may extend between the front and major surfaces thereof and at least a portion of the second conductive element may overlie the major surface of the second semiconductor element. The method may further include the steps of juxtaposing a portion of the second conductive element overlying the major surface of the second semiconductor element with an electrically conductive pad exposed at a front surface of a third semiconductor element; forming an opening extending through the conductive pad of the third semiconductor element and exposing a surface of the second conductive element; and forming a third electrically conductive element through the conductive pad of the third semiconductor element, the third conductive element extending at least within the opening of the third semiconductor element and through a thickness of the third semiconductor element, the third conductive element electrically contacting the conductive pad of the third semiconductor element and the second conductive element. The conductive pad of the third semiconductor element may overlie the conductive pad of the first semiconductor element. The conductive pad of the third semiconductor element may at least partly overlie the major surface of the second semiconductor element.

The method may further comprise forming at least one dielectric layer overlying at least one of the major surface of the first semiconductor element or the front surface and the second semiconductor element prior to step (a). The at least one dielectric layer may be an adhesive. The first conductive element may include a pad overlying the major surface of the first semiconductor element. At least a portion of the second conductive element may or may not conform to a contour of an interior surface of the opening in the second semiconductor element. The second conductive element may fully fill the opening with metal from an exposed surface of the first conductive element to the major surface of the second semiconductor element. The second conductive element may fill the opening with metal from an exposed surface of the first conductive element to a height above the exposed surface, the second conductive element including a layer of metal extending beyond the height along an interior surface of the opening, the layer partially occupying a space within the opening above the height.

A second aspect of the present invention is a method of forming a stacked microelectronic assembly comprising the steps of (a) juxtaposing a first electrically conductive element overlying a major surface of a first semiconductor element with an electrically conductive pad exposed at a front surface of a second semiconductor element, wherein the second semiconductor element includes a first opening extending from a rear surface of the second semiconductor element towards a front surface thereof, the first opening being at least partially aligned with the conductive pad; (b) forming a second opening extending from the first opening of the second semiconductor element through the conductive pad and at least exposing a portion of the first conductive element; and (c) forming a second electrically conductive element extending through the first and second openings, the conductive pad and at least contacting the first conductive element, the second conductive element electrically connecting the conductive pad and the first conductive element.

A third aspect of the present invention is a method of forming a stacked microelectronic assembly comprising the steps of (a) juxtaposing a first electrically conductive element overlying a major surface of a first semiconductor element with an electrically conductive pad exposed at a front surface of a second semiconductor element; (b) forming an opening extending through the conductive pad of the second semiconductor element and through the first conductive element, wherein forming an opening includes forming a first opening extending from a major surface of the second semiconductor element towards the front surface thereof, and a second opening extending from the first opening through the conductive pad and the first conductive element wherein where the first and second openings meet, interior surfaces of the first and second openings extend at different angles relative to the major surface of the second semiconductor element; and (c) forming a second electrically conductive element through the conductive pad, the second conductive element extending at least within the opening and through a thickness of the second semiconductor element, the second conductive element electrically contacting the conductive pad and the first conductive element.

In accordance with certain embodiments of this third aspect, at least the second semiconductor element may have a plurality of active semiconductor devices disposed therein. The first semiconductor element may have a plurality of active semiconductor devices disposed therein. The second opening may extend between the front surface and the major surface of the second semiconductor element and at least a portion of the second conductive element may overlie the major surface of the second semiconductor element.

The method may further comprise the steps of juxtaposing a portion of the second conductive element overlying the major surface of the second semiconductor element with an electrically conductive pad exposed at a front surface of a third semiconductor element; forming an opening extending through the conductive pad of the third semiconductor element and at least exposing the second conductive element; and forming a third electrically conductive element through the conductive pad of the third semiconductor element, the third conductive element extending at least within the opening of the third semiconductor element and through a thickness of the third semiconductor element, the third conductive element electrically contacting the conductive pad of the third semiconductor element and the second conductive element.

The conductive pad of the third semiconductor element may overlie the conductive pad of the first semiconductor element. The conductive pad of the third semiconductor element may at least partly overlie the major surface of the second semiconductor element.

The first semiconductor element may have a plurality of active semiconductor devices therein, and the major surface may be a front surface of the first semiconductor element, wherein the first conductive element is at least one of a conductive pad or a conductive element electrically connected with a conductive pad. The first semiconductor element may have a plurality of active semiconductor devices therein, the major surface may be a rear surface of the first semiconductor element, the first semiconductor element having a front surface remote from the rear surface, an electrically conductive pad exposed at the front surface, and an opening extending between the front and rear surfaces and at least partly underlying the conductive pad of the first semiconductor element, wherein the first conductive element is electrically connected to the conductive pad of the first semiconductor element through the opening of the first semiconductor element. The opening of the first semiconductor element may include a first opening extending from the major surface thereof towards the front surface thereof, and a second opening extending from the first opening to the conductive pad, wherein where the first and second openings meet, interior surfaces of the first and second openings extend at different angles relative to the major surface of the first semiconductor element. The entirety of the conductive pad of the second semiconductor element may overlie the major surface of the first semiconductor element.

The method may further comprise forming at least one dielectric layer overlying at least one of the major surface of the first semiconductor element and the front surface of the second semiconductor element prior to step (a). The at least one dielectric layer may be an adhesive. The second conductive element may fully fill the opening with metal through the first conductive element to the major surface of the second semiconductor element, wherein the metal extends beyond the first conductive element into the at least one dielectric layer. The second conductive element may fill the opening with metal through the first conductive element to a height above the first conductive element, the second conductive element including a layer of metal extending beyond the height along an interior surface of the opening, the layer partially occupying a space within the opening above the height, wherein the metal extends beyond the first conductive element into the at least one dielectric layer.

The first conductive element may include a pad overlying the major surface of the first semiconductor element. At least a portion of the second conductive element may or may not conform to a contour of an interior surface of the opening in the second semiconductor element. The second conductive element may fully fill the opening with metal through the first conductive element to the major surface of the second semiconductor element. The second conductive element may fill the opening with metal through the first conductive element to a height above the first conductive element, the second conductive element including a layer of metal extending beyond the height along an interior surface of the opening, the layer partially occupying a space within the opening above the height.

A fourth aspect of the present invention is a method of forming a stacked microelectronic assembly comprising the steps of (a) juxtaposing a first electrically conductive element overlying a major surface of a first semiconductor element with an electrically conductive pad exposed at a front surface of a second semiconductor element, wherein the second semiconductor element includes a first opening extending from a rear surface of the second semiconductor element towards a front surface thereof, the first opening being at least partially aligned with the conductive pad; (b) forming a second opening extending from the first opening of the second semiconductor element through the conductive pad and through the first conductive element; and (c) forming a second electrically conductive element extending through the first and second openings, the conductive pad and the first conductive element, the second conductive element electrically connecting the conductive pad and the first conductive element.

A fifth aspect of the present invention is an assembly comprising a first semiconductor element having a first conductive element exposed at a major surface thereof; a second semiconductor element having a front surface juxtaposed with the major surface of the first semiconductor element, a plurality of active semiconductor devices therein, and a conductive pad exposed at the front surface thereof, the conductive pad at least partly overlying the first conductive element, the second semiconductor element including an opening extending from a major surface thereof through the conductive pad and exposing the first conductive element; and a first metal element extending within the opening, through a thickness of the second semiconductor element, and through the conductive pad, the first metal element electrically interconnecting the conductive pad with the conductive element, wherein the opening of the second semiconductor element includes a first opening extending from a major surface of the second semiconductor element towards the front surface thereof, and a second opening extending from the first opening through the conductive pad, wherein where the first and second openings meet, interior surfaces of the first and second openings extend at different angles relative to the major surface of the second semiconductor element.

In accordance with certain embodiments of this fifth aspect, the first metal element may include at least a portion overlying the major surface of the second semiconductor element. The assembly may further include a third semiconductor element having a front surface juxtaposed with the major surface of the second semiconductor element, a plurality of active semiconductor devices therein, and a conductive pad exposed at the front surface thereof, the conductive pad of the third semiconductor element at least partly overlying the major surface of the second semiconductor element, the third semiconductor element including an opening extending from a major surface thereof through the conductive pad thereof and exposing the first metal element; and a second metal element extending within the opening of the third semiconductor element and electrically interconnecting the conductive pad of the third semiconductor element with the first metal element. The conductive pad of the third semiconductor element may at least partly overlie the first conductive element.

The first metal element may include a portion at least partially filling the opening. At least one dielectric layer may overlie at least one of the major surface of the first semiconductor element and the front surface of the second semiconductor element. The at least one dielectric layer may be an adhesive. The first conductive element may include a pad overlying the major surface of the first semiconductor element.

The first semiconductor element may have a front surface remote from the major surface, an opening extending between the front and major surfaces at least partly underlying a surface of a conductive pad exposed at the front surface of the first semiconductor element, wherein the first conductive element is electrically connected to the conductive pad of the first semiconductor element through the opening in the first semiconductor element. The opening of the first semiconductor element may include a first opening extending from the major surface thereof towards the front surface thereof, and a second opening extending from the first opening to the conductive pad, wherein where the first and second openings meet, interior surfaces of the first and second openings extend at different angles relative to the major surface of the first semiconductor element. The entirety of the conductive pad of the second semiconductor element may overlie the major surface of the first semiconductor element.

At least a portion of the first metal element may or may not conform to a contour of a surface of the opening. The first semiconductor element may include a plurality of active semiconductor devices. The first metal element may fully fill the opening with metal from an exposed surface of the first conductive element to the major surface of the second semiconductor element. The first metal element may fill the opening with metal from an exposed surface of the first conductive element to a height above the exposed surface, the first metal element including a layer of metal extending beyond the height along an interior surface of the opening, the layer partially occupying a space within the opening above the height. A system may be provided including an assembly as described above and one or more other electronic components electrically connected to the assembly. The system may further include a housing, the assembly and the other electronic components being mounted to the housing.

A sixth aspect of the present invention is an assembly comprising a first semiconductor element having a first conductive element exposed at a major surface thereof; a second semiconductor element having a front surface juxtaposed with the major surface of the first semiconductor element, a plurality of active semiconductor devices therein, and a conductive pad exposed at the front surface thereof, the conductive pad at least partly overlying the first conductive element, the second semiconductor element including an opening extending from a major surface thereof through the conductive pad and the first conductive element; and a first metal element extending within the opening, through a thickness of the second semiconductor element, and through the conductive pad, the first metal element electrically interconnecting the conductive pad with the conductive element, wherein the opening of the second semiconductor element includes a first opening extending from a major surface of the second semiconductor element towards the front surface thereof, and a second opening extending from the first opening through the conductive pad, wherein where the first and second openings meet, interior surfaces of the first and second openings extend at different angles relative to the major surface of the second semiconductor element.

In accordance with certain embodiments of this sixth aspect, the first metal element may include at least a portion overlying the major surface of the second semiconductor element. The assembly may further include a third semiconductor element having a front surface juxtaposed with the major surface of the second semiconductor element, a plurality of active semiconductor devices therein, and a conductive pad exposed at the front surface thereof, the conductive pad of the third semiconductor element at least partly overlying the major surface of the second semiconductor element, the third semiconductor element including an opening extending from a major surface thereof through the conductive pad thereof and the first metal element; and a second metal element extending within the opening of the third semiconductor element and electrically interconnecting the conductive pad of the third semiconductor element with the first metal element.

The conductive pad of the third semiconductor element may at least partly overlie the first conductive element. The first metal element may include a portion at least partially filling the opening. At least one dielectric layer may overlie at least one of the major surface of the first semiconductor element and the front surface of the second semiconductor element. The at least one dielectric layer may be an adhesive. The first metal element may fully fill the opening with metal through the first conductive element to the major surface of the second semiconductor element, wherein the metal extends beyond the first conductive element into the at least one dielectric layer. The first metal element may fill the opening with metal through the first conductive element to a height above the first conductive element, the first metal element including a layer of metal extending beyond the height along an interior surface of the opening, the layer partially occupying a space within the opening above the height, wherein the metal extends beyond the first conductive element into the at least one dielectric layer.

The first conductive element may include a pad overlying the major surface of the first semiconductor element. The first semiconductor element may have a front surface remote from the major surface, an opening extending between the front and major surfaces at least partly underlying a surface of a conductive pad exposed at the front surface of the first semiconductor element, wherein the first conductive element is electrically connected to the conductive pad of the first semiconductor element through the opening in the first semiconductor element. The opening of the first semiconductor element may include a first opening extending from the major surface thereof towards the front surface thereof, and a second opening extending from the first opening to the conductive pad, wherein where the first and second openings meet, interior surfaces of the first and second openings extend at different angles relative to the major surface of the first semiconductor element. The entirety of the conductive pad of the second semiconductor element may overlie the major surface of the first semiconductor element.

At least a portion of the first metal element may or may not conform to a contour of a surface of the opening. The first semiconductor element may include a plurality of active semiconductor devices. The first metal element may fully fill the opening with metal through the first conductive element to the major surface of the second semiconductor element. The first metal element may fill the opening with metal through the first conductive element to a height above the first conductive element, the first metal element including a layer of metal extending beyond the height along an interior surface of the opening, the layer partially occupying a space within the opening above the height. A system may be provided including an assembly as described above and one or more other electronic components electrically connected to the assembly. The system may further include a housing, the assembly and the other electronic components being mounted to the housing.

BRIEF DESCRIPTION OF THE DRAWINGS

FIGS. 11-13 are front perspective views of alternatives to the structure shown in FIG. 10a.

FIG. 14 is a front perspective view of the assembled structure of FIGS. 1-8, 8a, 9, 9a, 10, and 10a.

FIGS. 15-17 are front perspective views of alternatives to the structure shown in FIG. 10a.

DETAILED DESCRIPTION

As used in this disclosure, a statement that an electrically conductive element is "exposed at" a surface of a dielectric element indicates that the electrically conductive element is available for contact with a theoretical point moving in a direction perpendicular to the surface of the dielectric element toward the surface of the dielectric element from outside the dielectric element. Thus, a terminal or other conductive element which is exposed at a surface of a dielectric element may project from such surface; may be flush with such surface; or may be recessed relative to such surface and exposed through a hole or depression in the dielectric.

Figure 1:
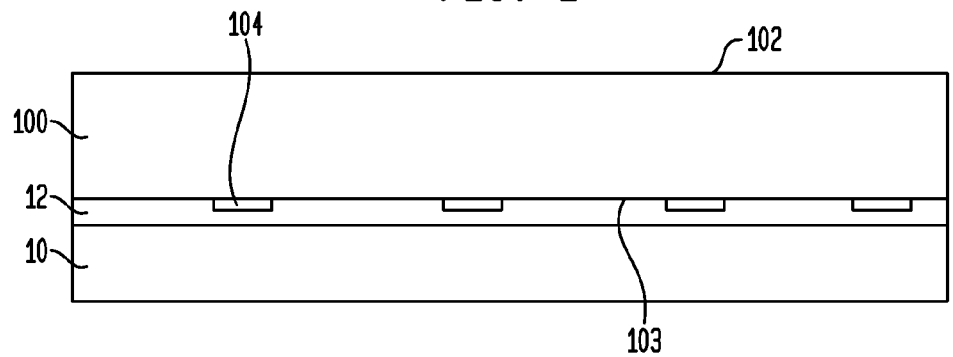
FIGS. 1-8, 8a, 9, 9a, 10, and 10a are front perspective views of an assembly showing various steps of making a structure in accordance with the present invention.
Figure 2:
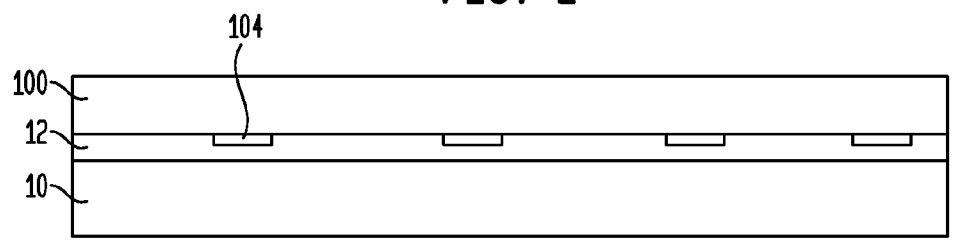
Figure 3:
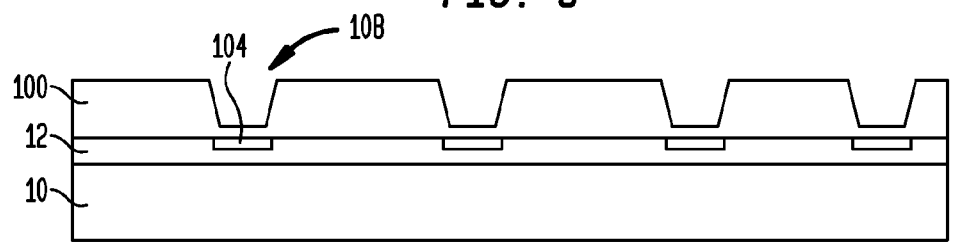
Figure 4:
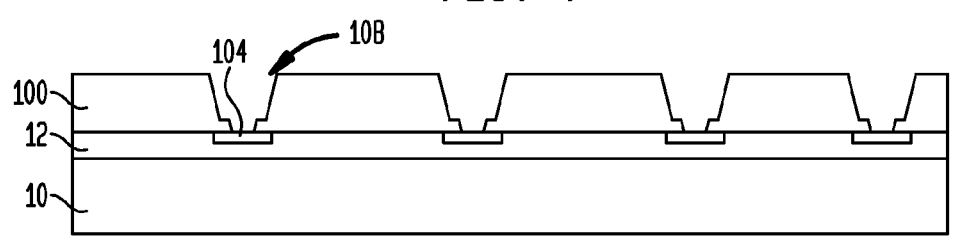
Figure 14:
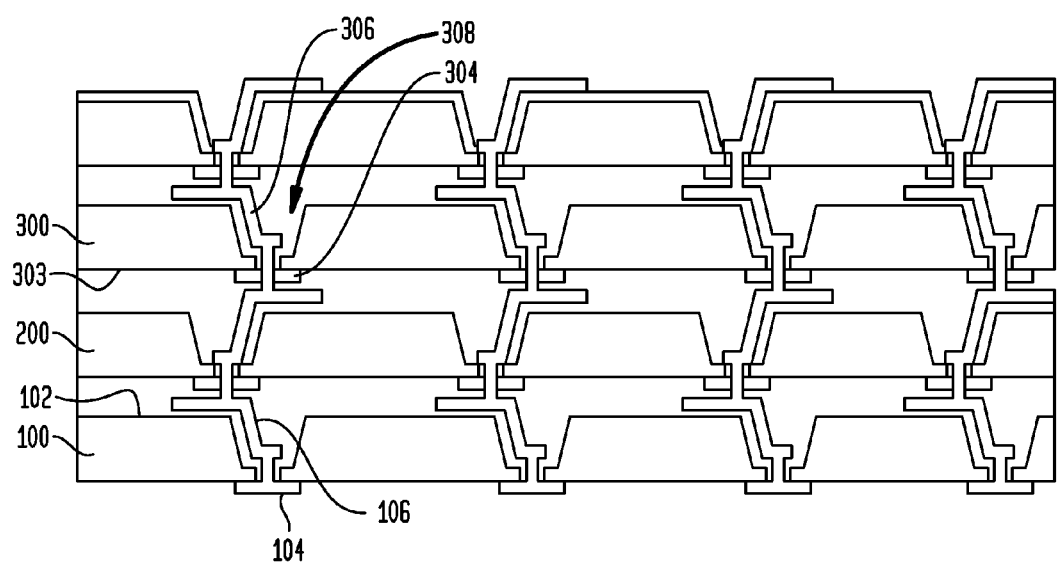

A first embodiment of a semiconductor element package 90, shown in FIG. 14, will be herein described according to its method of construction. A semiconductor element 100, such as a wafer or portion thereof, is shown in FIG. 1 having a major, or rear, surface 102 and a front surface 103. The semiconductor element, i.e., wafer, or wafer portion, includes one or more semiconductor chips which can be attached together at peripheral edges thereof. An electrically conductive pad is exposed at front surface 103. A carrier layer 10 is attached to the semiconductor element through an adhesive 12. Semiconductor element 100 is thinned, as shown in FIG. 2, and then one or more openings 108 can be formed in element 100, such as by etching, laser ablation, sandblasting, i.e., directing a stream of particles towards major surface 102, such as described in U.S. application Ser. No. 12/842,612 or by other means. FIG. 3 shows element 100 having four openings 108, though any number of openings is possible based on the dimensional limitations of element 100. Opening 108 extends from major surface 102 toward front surface 103, but initially terminates prior to reaching pad 104. As shown in FIG. 4, in one example, the opening 108 can be extended with a narrower dimension to expose pad 104. Opening 108 may have a continuous contour extending between major surface 102 and front surface 103, or may have a plurality of steps therebetween.

Figure 5:
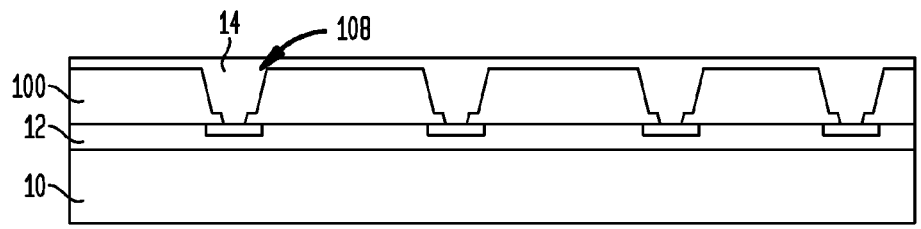
Figure 6:
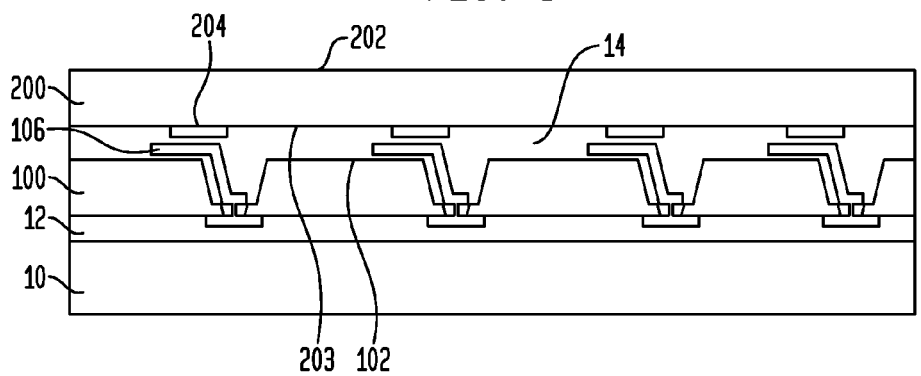

A dielectric layer 14, which may be an adhesive, can be positioned to overlie major surface 102, as shown in FIG. 5. FIG. 6 shows an electrically conductive element 106 juxtaposed to overlie major surface 102 of element 100, where conductive element 106 is electrically connected to pad 104 through opening 108 in element 100. Conductive element 106 may include an electrically conductive trace, a conductive pad, or a combination thereof. Within the opening 108, the conductive element 106 can be in shape of a trace, or can cover a portion or all of an interior surface of each opening 108. A second semiconductor element 200, having a construction similar to that of semiconductor element 100 (FIG. 1 or FIG. 2), having a rear surface 202, a front surface 203, and pads 204 exposed at front surface 203 can then be positioned to overlie major surface 102 and conductive elements 106 of element 100, as shown in FIG. 6. The pads 204 can be juxtaposed with the conductive elements 106 at positions overlying the major surface 102 of the lower semiconductor element 100. Pads 204 are positioned to partly or fully overlie the major surface 102. However the pads 204 may partly overlie the openings 108. In one embodiment, the entirety of pads 204 overlie major surface 102 and not openings 108.

Figure 7:
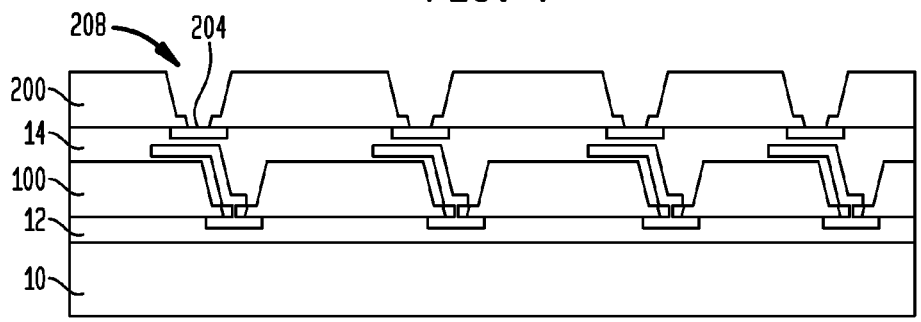
Figure 9:
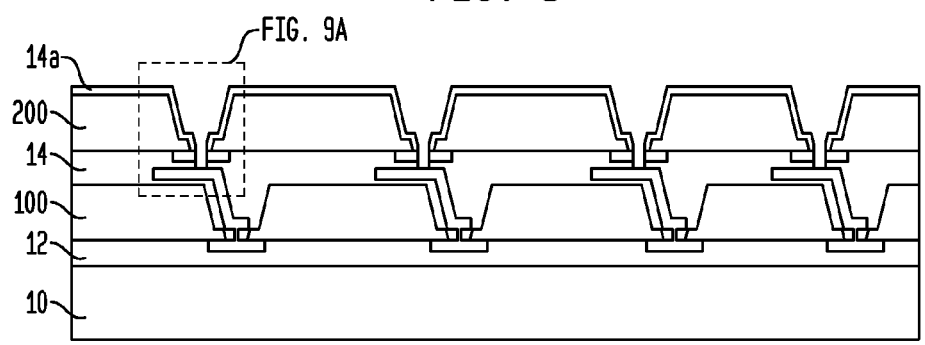
Figure 9A:
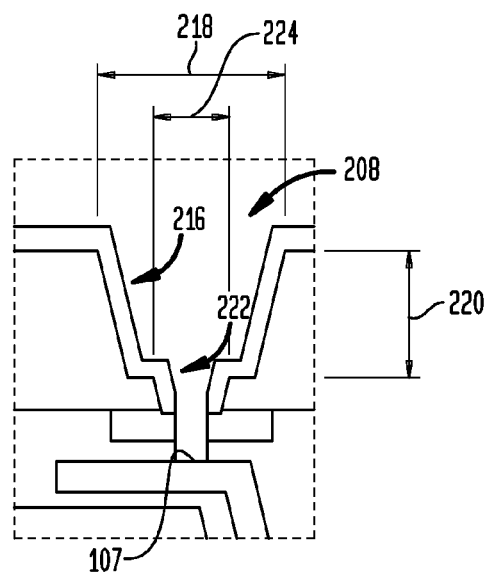
Figure 8:
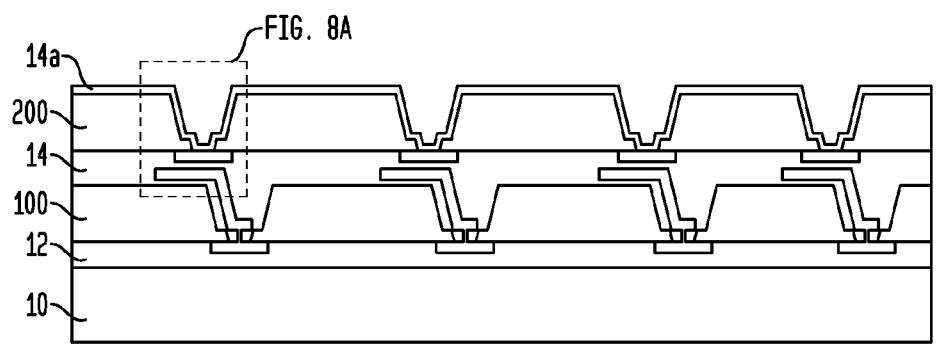
Figure 8A:
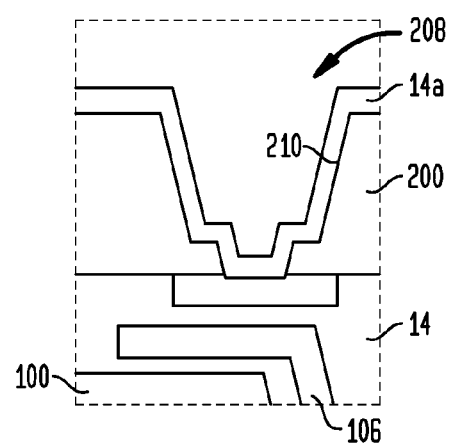
Figure 10:
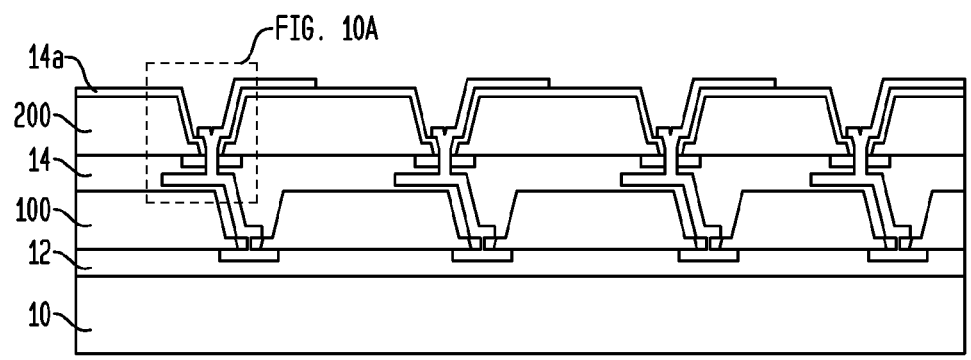
Figure 10A:
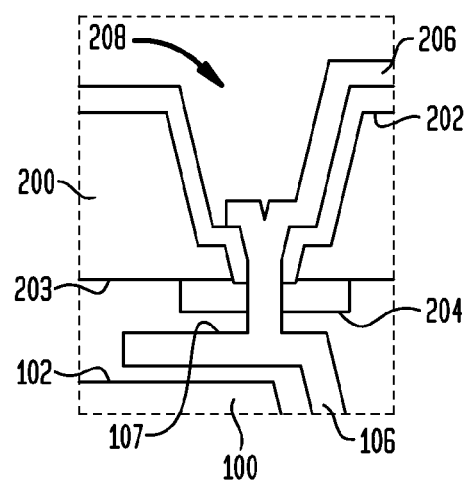

An opening 208 is formed in element 200 extending from rear surface 202 toward front surface 203, which can be in the same manner as the above-described opening 108. As shown in FIG. 7, openings 208 can expose pads 204 of element 200. In one example, dielectric layer 14a can be provided overlying rear surface 202 and interior surfaces 210 of openings 208, as shown in FIGS. 8 and 8a, after which opening 208 can be extended through conductive pads 204 to expose surfaces 107 of elements 106, as shown in FIGS. 9 and 9a, for example. A second electrically conductive element 206 is then provided to extend at least within opening 208, with conductive element 206 electrically contacting pad 204 and element 106, as shown in FIGS. 10 and 10a. A portion of conductive element 206 overlies rear surface 202 of element 200.

Figure 11:
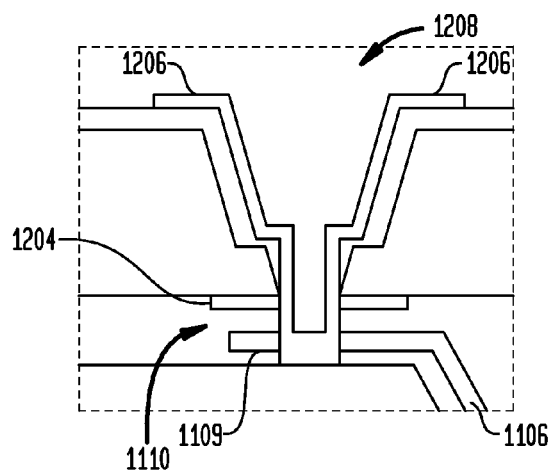
Figure 12:
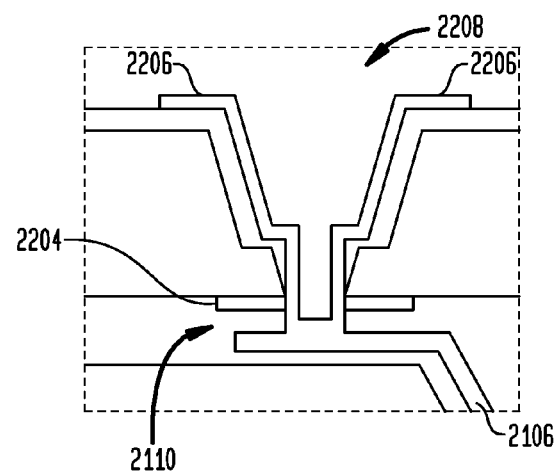
Figure 13:
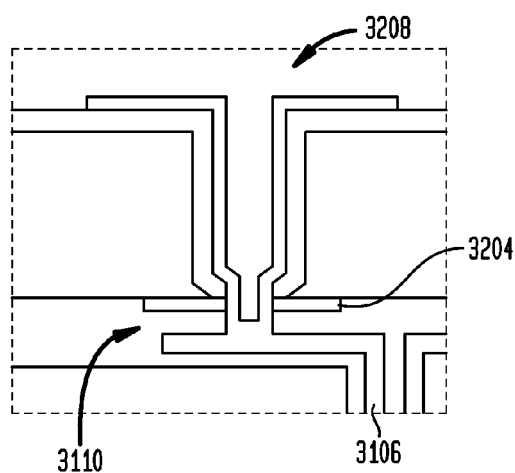

While FIG. 10a is shown with opening 208 exposing surface 107 of element 106, an opening 1208 may alternatively be formed through an element 1106 as shown in FIG. 11. In such a case, opening 1208 is formed through and an element 1206 extends beyond a surface 1109 of element 1106, and a gap 1110 is shown between pad 1204 and element 1106. In FIG. 12, a gap 2110 is shown between pad 2204 and element 2106. Two elements 2206 electrically contact pad 2204 and element 2106, with each element 2206 disposed on an opposing surface of an opening 2208. FIG. 13 depicts an embodiment in which an opening 3208 is narrow and include substantially parallel wall surfaces. A gap 3110 is also disposed between a pad 3204 and an element 3106.

The openings in the semiconductor elements have interior surfaces which can extend in directions normal to the major surface of the semiconductor elements or at an angle with respect to the normal direction to the semiconductor element major surface. Pads and conductive elements which are juxtaposed therewith may or may not have gaps therebetween. Further, while the openings may extend through conductive pads 206, they may not extend through the conductive elements which are juxtaposed therewith.

Figure 15:
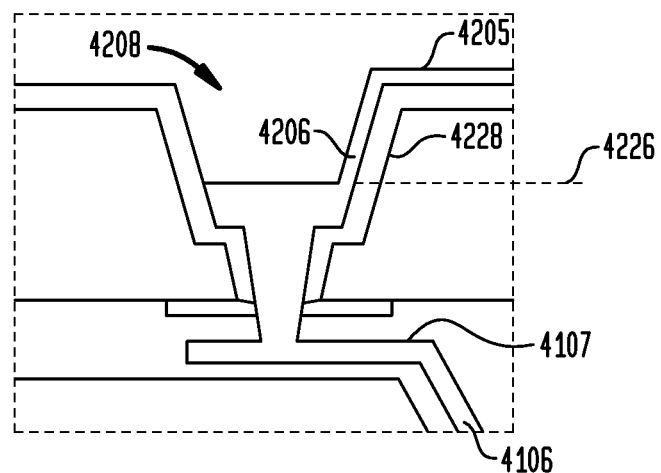
Figure 16:
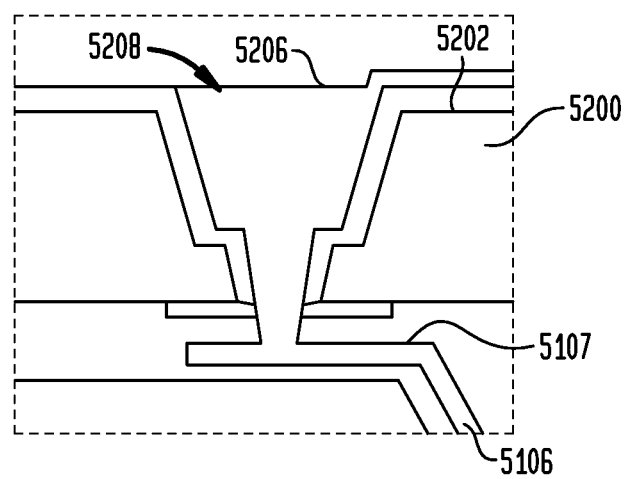
Figure 17:
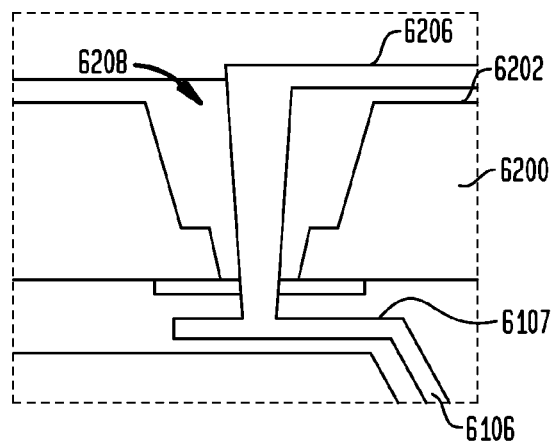

While conductive element 206 is shown as extending along a surface of opening 208, a conductive element according to the present invention may fill an opening with metal. As shown in FIG. 15, a conductive element 4206 fills an opening 4208 with metal from an exposed surface 4107 of a first conductive element 4106 to a height 4226 above exposed surface 4107. Conductive element 4206 includes a layer 4205 of metal extending beyond height 4226 along an interior surface 4228 of opening 4208. Layer 4205 partially occupies a space within opening 4208 above height 4226. Alternatively, as shown in FIG. 16, a conductive element 5206 fully fills an opening 5208 with metal from an exposed surface 5107 of a first conductive element 5106 to a rear surface 5202 of a second semiconductor element 5200. Of course, as described above, an opening as described herein, and the metal filling same, may extend from the pad of a semiconductor element toward the rear surface thereof or may extend through the conductive element of an adjacent semiconductor element. In yet another alternative embodiment shown in FIG. 17, an opening 6208 in a semiconductor element 6200 is filled with a dielectric and lased so that a second conductive element 6206 may extend from an exposed surface 6107 of a first conductive element 6106 to a rear surface 6202 of element 6200. Conductive element 6206 does not conform to the contours of opening 6208, but rather extends in a narrow vertical direction with respect to semiconductor element 6200.

As shown in FIG. 14, third and additional levels may be assembled to the assembly of FIG. 10, with such levels being constructed according to the above-described method with respect to element 200. For example, the third level includes an electrically conductive pad 304 exposed at a front surface 303 of a third semiconductor element 300. Pad 304 is juxtaposed with a portion of conductive element 206 overlying rear surface 202 of semiconductor element 200. An opening 308 extends through pad 304 and exposes a surface of conductive element 206. Alternatively, as discussed above, opening 308 may extend through conductive element 206. A third electrically conductive element 306 is plated extending at least within opening 308 and contacting pad 304 and conductive element 206. Pad 304 is positioned with respect to element 200 in the same manner that pad 204 is positioned with respect to element 100. That is, pad 304 preferably overlies rear surface 202 of element 200 and not opening 208, though some overlap with opening 208 is allowable. Among non-adjacent levels, it is often desirable to have pads overlie one another. As such, pad 304 may overlie pad 104 of semiconductor element 100, as shown in FIG. 14.

With reference to FIG. 9a, an opening in a semiconductor element, such as opening 208, may include a first opening 216 and a second opening 222. The first opening 216 can have a first width 218 and extends from rear surface 202 at least partially through a thickness 220 of opening 208. Second opening 222 extends from the first opening at least through pad 204 and has a second width 224 that is different from first width 218. As shown in FIG. 9a, second opening 222 extends toward surface 107 of conductive element 106, though second opening may only extend to pad 204. First opening 216 and second opening 222 meet at a location with in thickness 220 of element 200, and each may have a profile with parallel or slanted walls, or be configured otherwise.

FIG. 14 depicts an assembly according to the above described methods of construction. First semiconductor element 100 includes first conductive element 106 exposed at major surface 102. Second semiconductor element 200 includes front surface 203 juxtaposed with major surface 102 of semiconductor element 100 and has a plurality of active semiconductor devices therein. Conductive pad 204 is exposed at front surface 203 and overlies conductive element 106. Semiconductor element 200 further includes opening 208 extending from rear surface 202 through conductive pad 204 and exposing, or alternatively extending through, first conductive element 206. Second electrically conductive element 206, or a plated metal element, extends within opening 208 and electrically interconnects conductive pad 204 with conductive element 106. Of course, the assembly shown in FIG. 14 includes a third and a fourth level according to the above-described embodiments.

Figure 18:
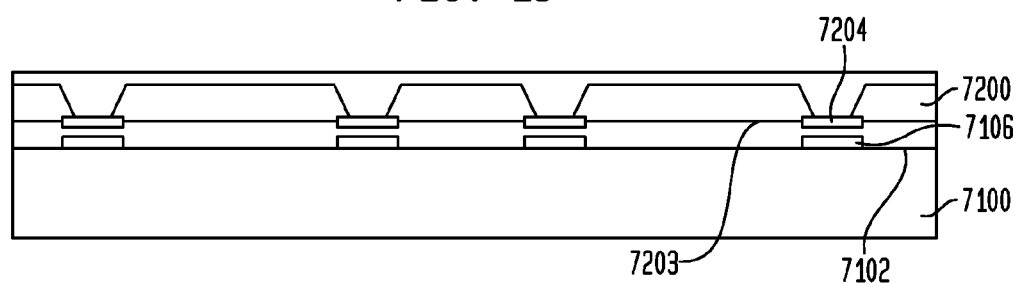
FIGS. 18 and 19 are front perspective views of an assembly showing various steps of making a structure in accordance with another embodiment of the present invention.
Figure 19:
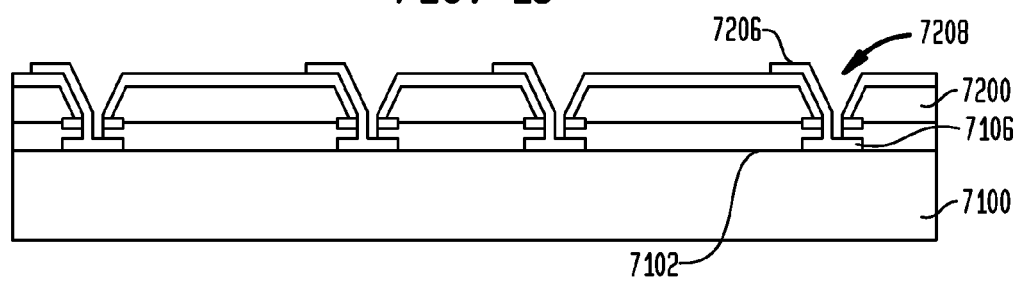

FIGS. 18 and 19 depict another embodiment including a first semiconductor element 7100 having a plurality of active semiconductor devices therein and a major surface 7102, or front surface. A conductive pad 7106 overlies major surface 7102. In alternative embodiments, pad 7106 may be comprised of a conductive element exposed at major surface 7102 and electrically connected with a conductive pad. In such example, the conductive element can be part of a redistribution layer formed in contact with the conductive pad 7106, such redistribution layer including an additional pad, a conductive trace or both. A second semiconductor element 7200 having a front surface 7203 and pads 7204 exposed at front surface 7203 is positioned to overlie major surface 7102 and conductive pads 7106 of element 7100. Pads 7204 are preferably positioned adjacent conductive pads 7106. As shown in FIG. 19, an electrically conductive element 7206 is plated through an opening 7208 in semiconductor element 7200 according to the above-described embodiments. With the base assembly shown in FIG. 19, additional levels may be constructed according also according to the above-described embodiments as desired.

The conductive elements herein described may be either conformal or non-conformal with a contour of an interior surface of the opening through which they are formed, such as by a plating process.

In certain embodiments, at least semiconductor element 200 has a plurality of active semiconductor devices disposed therein. In further embodiments, semiconductor element 100 also has a plurality of active semiconductor devices disposed therein.

In particular embodiments discussed above, the resulting assemblies can be or include a microelectronic unit having active circuit elements, e.g., transistors, diodes, or other microelectronic or microelectromechanical devices therein, among others, and have traces formed non-photolithographically as described above. Also in certain embodiments discussed above, the resulting assemblies can be or include an interposer structure having a substrate of at least one of semiconductor or dielectric material which has traces formed non-photolithographically as described above but which does not have active circuit elements therein. An interposer structure or component in accordance such embodiments can have conductive elements exposed at one or more of the front and rear faces for interconnection with one or more external components such as, for example, a microelectronic element, substrate or circuit panel.

Figure 20:
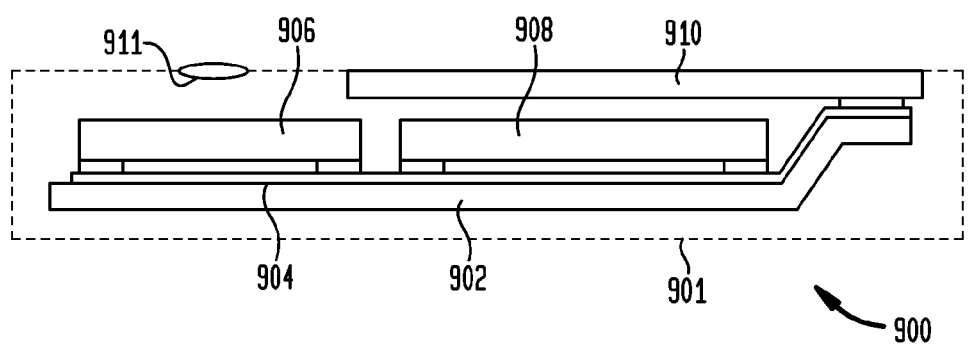
FIG. 20 is a schematic depiction of a system according to one embodiment of the invention.

The structures discussed above provide extraordinary three-dimensional interconnection capabilities. These capabilities can be used with chips of any type. Merely by way of example, the following combinations of chips can be included in structures as discussed above: (i) a processor and memory used with the processor; (ii) plural memory chips of the same type; (iii) plural memory chips of diverse types, such as DRAM and SRAM; (iv) an image sensor and an image processor used to process the image from the sensor; (v) an application-specific integrated circuit ("ASIC") and memory. The structures discussed above can be utilized in construction of diverse electronic systems. For example, a system 900 in accordance with a further embodiment of the invention includes a structure 906 as described above in conjunction with other electronic components 908 and 910. In the example depicted, component 908 is a semiconductor chip whereas component 910 is a display screen, but any other components can be used. Of course, although only two additional components are depicted in FIG. 20 for clarity of illustration, the system may include any number of such components. The structure 906 as described above may be, for example, a composite chip or a structure incorporating plural chips. In a further variant, both may be provided, and any number of such structures may be used. Structure 906 and components 908 and 910 are mounted in a common housing 901, schematically depicted in broken lines, and are electrically interconnected with one another as necessary to form the desired circuit. In the exemplary system shown, the system includes a circuit panel 902 such as a flexible printed circuit board, and the circuit panel includes numerous conductors 904, of which only one is depicted in FIG. 20, interconnecting the components with one another. However, this is merely exemplary; any suitable structure for making electrical connections can be used. The housing 901 is depicted as a portable housing of the type usable, for example, in a cellular telephone or personal digital assistant, and screen 910 is exposed at the surface of the housing. Where structure 906 includes a light-sensitive element such as an imaging chip, a lens 911 or other optical device also may be provided for routing light to the structure. Again, the simplified system shown in FIG. 20 is merely exemplary; other systems, including systems commonly regarded as fixed structures, such as desktop computers, routers and the like can be made using the structures discussed above.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A method of forming a stacked microelectronic assembly comprising the steps of:
   (a) juxtaposing a first electrically conductive element overlying a major surface of a first semiconductor element with an electrically conductive pad exposed at a front surface of a second semiconductor element, wherein the first semiconductor element has a front surface remote from the major surface, an opening extending between the front and major surfaces thereof at least partly aligned with a surface of a conductive pad exposed at the front surface of the first semiconductor element, wherein the first conductive element is electrically connected to the conductive pad exposed at the front surface of the first semiconductor element through the opening in the first semiconductor element, wherein an interior surface of the opening of the first semiconductor element is lined with a dielectric layer;
   (b) forming an opening extending through the conductive pad exposed at the front surface of the second semiconductor element and through the first conductive element; and
   (c) forming a second electrically conductive element through the conductive pad exposed at the front surface of the second semiconductor element, the second conductive element extending at least within the opening in the conductive pad exposed at the front surface of the second semiconductor element and through a thickness of the second semiconductor element, the second conductive element electrically contacting the conductive pad exposed at the front surface of the second semiconductor element and the first conductive element.

2. The method of claim 1, wherein forming an opening includes forming a first opening extending from a major surface of the second semiconductor element towards the front surface thereof, and a second opening extending from the first opening in the second semiconductor element through the conductive pad exposed at the front surface of the second semiconductor element and the first conductive element, wherein where the first and second openings in the second semiconductor element meet, interior surfaces of the first and second openings of the second semiconductor element extend at different angles relative to the major surface of the second semiconductor element.

3. The method of claim 2, wherein the opening of the first semiconductor element includes a first opening extending from the major surface thereof towards the front surface thereof, and a second opening extending from the first opening to the conductive pad exposed at the front surface of the first semiconductor element, wherein where the first and second openings meet, interior surfaces of the first and second openings extend at different angles relative to the major surface of the first semiconductor element.

4. The method of claim 1, wherein at least the second semiconductor element has a plurality of active semiconductor devices disposed therein.

5. The method of claim 4, wherein the first semiconductor element has a plurality of active semiconductor devices disposed therein.

6. The method of claim 1, wherein the opening in the second semiconductor element extends between the front surface and a major surface of the second semiconductor element and at least a portion of the second conductive element overlies the major surface of the second semiconductor element.

7. The method of claim 6, further comprising the steps of:
juxtaposing a portion of the second conductive element overlying the major surface of the second semiconductor element with an electrically conductive pad exposed at a front surface of a third semiconductor element;
forming an opening extending through the conductive pad exposed at the front surface of the third semiconductor element and at least exposing the second conductive element; and
forming a third electrically conductive element through the conductive pad exposed at the front surface of the third semiconductor element, the third conductive element extending at least within the opening of the third semiconductor element and through a thickness of the third semiconductor element, the third conductive element electrically contacting the conductive pad exposed at the front surface of the third semiconductor element and the second conductive element.

8. The method of claim 7, wherein the conductive pad exposed at the front surface of the third semiconductor element overlies the conductive pad exposed at the front surface of the first semiconductor element.

9. The method of claim 7, wherein the conductive pad exposed at the front surface of the third semiconductor element at least partly overlies the major surface of the second semiconductor element.

10. The method of claim 1, wherein the first semiconductor element has a plurality of active semiconductor devices therein, and the major surface of the first semiconductor element is a front surface thereof, wherein the first conductive element is at least one of a conductive pad or a conductive element electrically connected with a conductive pad.

11. The method of claim 1, wherein the first semiconductor element has a plurality of active semiconductor devices therein.

12. The method of claim 1, wherein the entirety of the conductive pad exposed at the front surface of the second semiconductor element overlies the major surface of the first semiconductor element.

13. The method of claim 1, further comprising forming at least one dielectric layer overlying at least one of the major surface of the first semiconductor element or the front surface of the second semiconductor element prior to step (a).

14. The method of claim 13, wherein the at least one dielectric layer is an adhesive.

15. The method of claim 13, wherein the second conductive element fully fills the opening of the second semiconductor element with metal through the first conductive element to a major surface of the second semiconductor element, wherein the metal extends beyond the first conductive element into the at least one dielectric layer.

16. The method of claim 13, wherein the second conductive element fills the opening of the second semiconductor element with metal through the first conductive element to a height above the first conductive element, the second conductive element including a layer of metal extending beyond the height along an interior surface of the opening of the second semiconductor element, the layer partially occupying a space within the opening of the second semiconductor element above the height, wherein the metal extends beyond the first conductive element into the at least one dielectric layer.

17. The method of claim 1, wherein the first conductive element includes a pad overlying the major surface of the first semiconductor element.

18. The method of claim 1, wherein at least a portion of the second conductive element conforms to a contour of an interior surface of the opening in the second semiconductor element.

19. The method of claim 1, wherein at least a portion of the second conductive element does not conform to a contour of an interior surface of the opening in the second semiconductor element.

20. The method of claim 1, wherein the second conductive element fully fills the opening of the second semiconductor element with metal through the first conductive element to a major surface of the second semiconductor element.

21. The method of claim 1, wherein the second conductive element fills the opening of the second semiconductor element with metal through the first conductive element to a height above the first conductive element, the second conductive element including a layer of metal extending beyond the height along an interior surface of the opening, the layer partially occupying a space within the opening above the height.

22. A method of forming a stacked microelectronic assembly comprising the steps of:
(a) juxtaposing a first electrically conductive element overlying a major surface of a first semiconductor element with an electrically conductive pad exposed at a front surface of a second semiconductor element, wherein the first semiconductor element has a front surface remote from the major surface, an opening extending between the front and major surfaces thereof at least partly aligned with a surface of a conductive pad exposed at the front surface of the first semiconductor element, wherein the first conductive element is electrically connected to the conductive pad exposed at the front surface of the first semiconductor element through the opening in the first semiconductor element, wherein an interior surface of the opening of the first semiconductor element is lined with a dielectric layer, wherein the second semiconductor element includes a first opening extending from a rear surface of the second semiconductor element towards the front surface thereof, the first opening of the second semiconductor element being at least partially aligned with the conductive pad exposed at the front surface of the second semiconductor element;
(b) forming a second opening in the second semiconductor element extending from the first opening of the second semiconductor element through the conductive pad exposed at the front surface of the second semiconductor element and through the first conductive element; and
(c) forming a second electrically conductive element extending through the first and second openings of the second semiconductor element, through the conductive pad exposed at the front surface of the second semiconductor element and the first conductive element, the second conductive element electrically connecting the conductive pad exposed at the front surface of the second semiconductor element and the first conductive element.

23. The method of claim 22, wherein the opening of the first semiconductor element includes a first opening extending from the major surface thereof towards the front surface thereof, and a second opening extending from the first opening to the conductive pad exposed at the front surface of the first semiconductor element, wherein where the first and second openings meet, interior surfaces of the first and second openings extend at different angles relative to the major surface of the first semiconductor element.

24. An assembly, comprising:
a first semiconductor element having a first conductive element exposed at a major surface thereof, wherein the first semiconductor element has a front surface remote from the major surface, an opening extending between the front and major surfaces thereof at least partly aligned with a surface of a conductive pad exposed at the front surface of the first semiconductor element, wherein the first conductive element is electrically connected to the conductive pad exposed at the front surface of the first semiconductor element through the opening in the first semiconductor element, wherein an interior surface of the opening of the first semiconductor element is lined with a dielectric layer;
a second semiconductor element having a front surface juxtaposed with the major surface of the first semiconductor element, a plurality of active semiconductor devices therein, and a conductive pad exposed at the front surface thereof, the conductive pad exposed at the front surface of the second semiconductor element at least partly overlying the first conductive element, the second semiconductor element including an opening extending from a major surface thereof through the conductive pad exposed at the front surface of the second semiconductor element and the first conductive element; and
a first metal element extending within the opening of the second semiconductor element, through a thickness of the second semiconductor element, and through the conductive pad exposed at the front surface of the second semiconductor element, the first metal element electrically interconnecting the conductive pad exposed at the front surface of the second semiconductor element with the first conductive element.

25. The assembly of claim 24, wherein the opening of the second semiconductor element includes a first opening extending from the major surface of the second semiconductor element towards the front surface thereof, and a second opening extending from the first opening of the second semiconductor element through the conductive pad exposed at the front surface of the second semiconductor element, wherein where the first and second openings of the second semiconductor element meet, interior surfaces of the first and second openings of the second semiconductor element extend at different angles relative to the major surface of the second semiconductor element.

26. The assembly of claim 25, wherein the opening of the first semiconductor element includes a first opening extending from the major surface thereof towards the front surface thereof, and a second opening extending from the first opening to the conductive pad exposed at the front surface of the first semiconductor element, wherein where the first and second openings meet, interior surfaces of the first and second openings extend at different angles relative to the major surface of the first semiconductor element.

27. The assembly of claim 24, wherein the first metal element includes at least a portion overlying the major surface of the second semiconductor element.

28. The assembly of claim 24, further comprising:
a third semiconductor element having a front surface juxtaposed with the major surface of the second semiconductor element, a plurality of active semiconductor devices therein, and a conductive pad exposed at the front surface thereof, the conductive pad exposed at the front surface of the third semiconductor element at least partly overlying the major surface of the second semiconductor element, the third semiconductor element including an opening extending from a major surface thereof through the conductive pad exposed at the front surface thereof and the first metal element; and
a second metal element extending within the opening of the third semiconductor element and electrically interconnecting the conductive pad exposed at the front surface of the third semiconductor element with the first metal element.

29. The assembly of claim 28, wherein the conductive pad exposed at the front surface of the third semiconductor element at least partly overlies the first conductive element.

30. The assembly of claim 24, wherein the first metal element includes a portion at least partially filling the opening of the second semiconductor element.

31. The assembly of claim 24, wherein at least one dielectric layer overlies at least one of the major surface of the first semiconductor element and the front surface of the second semiconductor element.

32. The assembly of claim 31, wherein the at least one dielectric layer is an adhesive.

33. The assembly of claim 31, wherein the first metal element fully fills the opening of the second semiconductor element with metal through the first conductive element to the major surface of the second semiconductor element, wherein the metal extends beyond the first conductive element into the at least one dielectric layer.

34. The assembly of claim 31, wherein the first metal element fills the opening of the second semiconductor element with metal through the first conductive element to a height above the first conductive element, the first metal element including a layer of metal extending beyond the height along an interior surface of the opening of the second semiconductor element, the layer partially occupying a space within the opening of the second semiconductor element above the height, wherein the metal extends beyond the first conductive element into the at least one dielectric layer.

35. The assembly of claim 24, wherein the first conductive element includes a pad overlying the major surface of the first semiconductor element.

36. The assembly of claim 24, wherein the entirety of the conductive pad exposed at the front surface of the second semiconductor element overlies the major surface of the first semiconductor element.

37. The assembly of claim 24, wherein at least a portion of the first metal element conforms to a contour of a surface of the opening of the second semiconductor element.

38. The assembly of claim 24, wherein at least a portion of the first metal element does not conform to a contour of a surface of the opening of the second semiconductor element.

39. The assembly of claim 24, wherein the first semiconductor element includes a plurality of active semiconductor devices.

40. The assembly of claim 24, wherein the first metal element fully fills the opening of the second semiconductor element with metal through the first conductive element to the major surface of the second semiconductor element.

41. The assembly of claim 24, wherein the first metal element fills the opening of the second semiconductor element with metal through the first conductive element to a height above the first conductive element, the first metal element including a layer of metal extending beyond the height along an interior surface of the opening of the second semiconductor element, the layer partially occupying a space within the opening of the second semiconductor element above the height.

42. A system comprising an assembly according to claim 24 and one or more other electronic components electrically connected to the assembly.

43. A system as claimed in claim 42 further comprising a housing, the assembly and the other electronic components being mounted to the housing.

* * * * *